(12) United States Patent
Bhatia et al.

(10) Patent No.: US 6,939,742 B2
(45) Date of Patent: Sep. 6, 2005

(54) THERMAL GAP CONTROL

(75) Inventors: Rakesh Bhatia, Austin, TX (US); Gregory A. James, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 180 days.

(21) Appl. No.: 10/213,667

(22) Filed: Aug. 6, 2002

(65) Prior Publication Data

US 2002/0189795 A1 Dec. 19, 2002

Related U.S. Application Data

(62) Division of application No. 09/409,951, filed on Sep. 30, 1999, now Pat. No. 6,472,742.

(51) Int. Cl.[7] .................. H01L 21/44; H01L 21/48; H01L 21/50
(52) U.S. Cl. ............... 438/117; 438/122; 257/706; 361/709; 361/801
(58) Field of Search ............... 257/678, 712–713, 257/717–719, 705; 438/121–122, 106; 361/704, 707, 709, 742, 758, 756, 759, 801–803

(56) References Cited

U.S. PATENT DOCUMENTS

| | | | | |
|---|---|---|---|---|
| 5,654,876 A | * | 8/1997 | Sathe et al. ............... | 361/704 |
| 5,713,690 A | * | 2/1998 | Corbin et al. ............. | 403/270 |
| 5,926,371 A | * | 7/1999 | Dolbear .................... | 361/704 |
| 5,959,838 A | * | 9/1999 | Liang ....................... | 361/697 |
| 5,960,862 A | * | 10/1999 | Hu .......................... | 165/80.3 |
| 5,963,428 A | * | 10/1999 | Salmonson et al. ........ | 361/704 |
| 5,969,947 A | * | 10/1999 | Johnson et al. ........... | 361/704 |
| 5,978,223 A | * | 11/1999 | Hamilton et al. .......... | 361/704 |
| 5,985,697 A | * | 11/1999 | Chaney et al. ............ | 438/122 |
| 5,990,552 A | * | 11/1999 | Xie et al. .................. | 257/718 |
| 6,229,702 B1 | * | 5/2001 | Tao et al. .................. | 361/174 |
| 6,249,440 B1 | * | 6/2001 | Affolter .................... | 361/769 |
| 6,373,703 B2 | * | 4/2002 | Johnson et al. ........... | 361/704 |
| 2001/0033476 A1 | * | 10/2001 | Dibene et al. ............. | 361/702 |
| 2002/0105071 A1 | * | 8/2002 | Mahajan et al. .......... | 257/720 |

* cited by examiner

*Primary Examiner*—Amir Zarabian
*Assistant Examiner*—Thanh Y. Tran
(74) *Attorney, Agent, or Firm*—Fish & Richardson P.C.

(57) ABSTRACT

A heat dissipating element (e.g., a heat sink) is held in an initial position closer to a heat generating structure (e.g., a microprocessor) and in a subsequent position farther from the microprocessor. A thermal interface material (e.g., a thermal grease) spans the gap, but is not held under compression, between the heat sink and the microprocessor.

20 Claims, 2 Drawing Sheets

THERMAL GAP CONTROL

Pursuant to 35 U.S.C. § 120, this application is a Divisional of prior U.S. application Ser. No. 09/409,951, filed Sep. 30, 1999 now U.S. Pat. No. 6,472,742. The disclosure of the prior application is considered part of, and is incorporated by reference in, the disclosure of this application.

BACKGROUND

To prevent microprocessors and other heat generating electronic components from overheating, excess heat is sometimes conducted to a heat sink where it is dissipated. The heat sink may be mounted above the microprocessor with a thermally conductive elastomer held in a thermal gap between the heat sink and the microprocessor. The elastomer is held in compression between the heat sink and the microprocessor to provide a good thermal conduction path that will last for a long period.

In such an approach, the distance between the upper surface of the printed circuit board and the upper surface of the microprocessor package may vary from unit-to-unit because of manufacturing tolerances. The spring device provides enough free play to accommodate such changes.

SUMMARY

In implementations of the invention, a heat dissipating element (e.g., a heat sink) is held in an initial position closer to a heat generating structure (e.g., a microprocessor) and in a subsequent position farther from the heat generating structure. A thermal interface material (e.g., a thermal grease) spans the gap, but is not held under compression, between the heat sink and the microprocessor.

Because no compression is applied to the thermal interface material, soft materials that have little or no strength to resist compressive forces may be used as the thermal interface. The thermally conductive path remains good over a long period. Variations in the thermal gap are accommodated without imposing a compressive force on the thermal interface material. Tight control over the size of the thermal gap is maintained.

Other advantages and features will become apparent from the following description and from the claims.

DESCRIPTION

Figure 1:
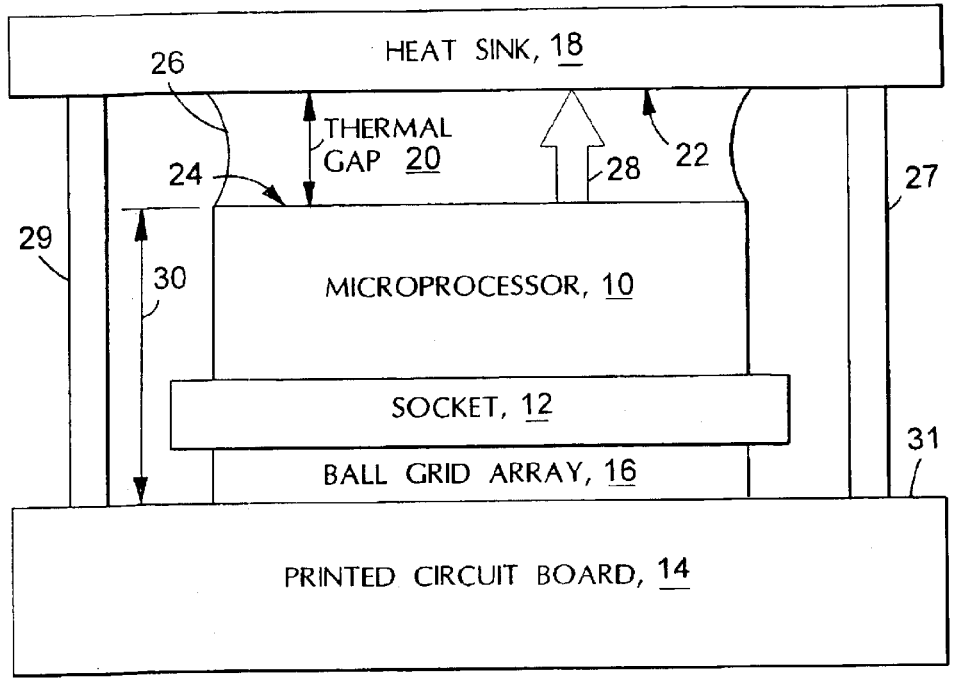
FIG. 1 is a schematic side view of a mounted microprocessor in accordance with an embodiment of the invention.

As seen in FIG. 1, a microprocessor 10 (or other heat generating device) is held in a socket 12 that is mounted on a printed circuit board 14 (e.g., a computer circuit board such as a motherboard) using a ball grid array 16. A metal block or plate forming a heat dissipating element (e.g., a heat sink 18) is attached to the board 14 using supports 27, 29 and is held in a position that defines a thermal gap 20 between the bottom surface 22 of the heat sink and the top surface 24 of the microprocessor 10. (Although only two supports are shown in the figure, there are actually three or more supports arranged in a triangle or a rectangle.) A thermal grease, gel, or other soft, highly thermally conductive material 26 spans the gap 20 and defines a heat conducting path 28 from the microprocessor to the heat sink. The grease is not held under compression so it remains in place and provides a good thermal path 28 over a long period without begin squeezed from the gap.

The height 30 from the top surface 31 of the board to the top surface 24 of the microprocessor varies from unit to unit because of manufacturing variations. It is desirable for the gaps 20 in different units to be of the same height despite of the differences in the heights 30, in order to provide a consistent adequate thermal path.

Figure 2:
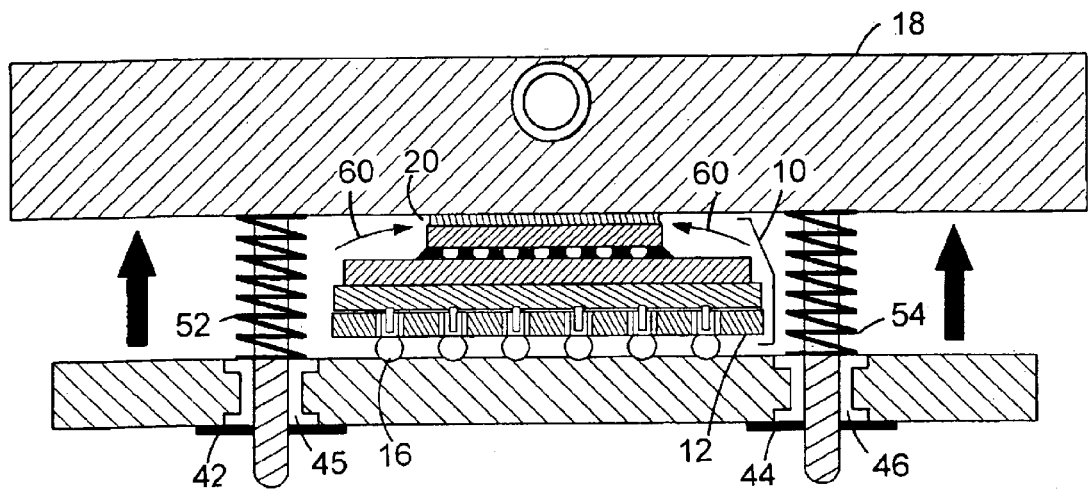
FIGS. 2 and 3 are cross-sectional schematic side views in more detail, showing two stages in manufacturing.

As seen in FIG. 2, the gap 20 is kept at a desired fixed height by an arrangement in which the four supports (pins in this case) 27, 29 are securely attached to the heat sink at their upper ends, pass through four corresponding holes 45, 46 in the printed circuit board, and are securely attached to the board by locking clips 42, 44 held on the lower surface of the board. High-stiffness coiled spacer springs 52, 54 surround the pins.

Figure 4:
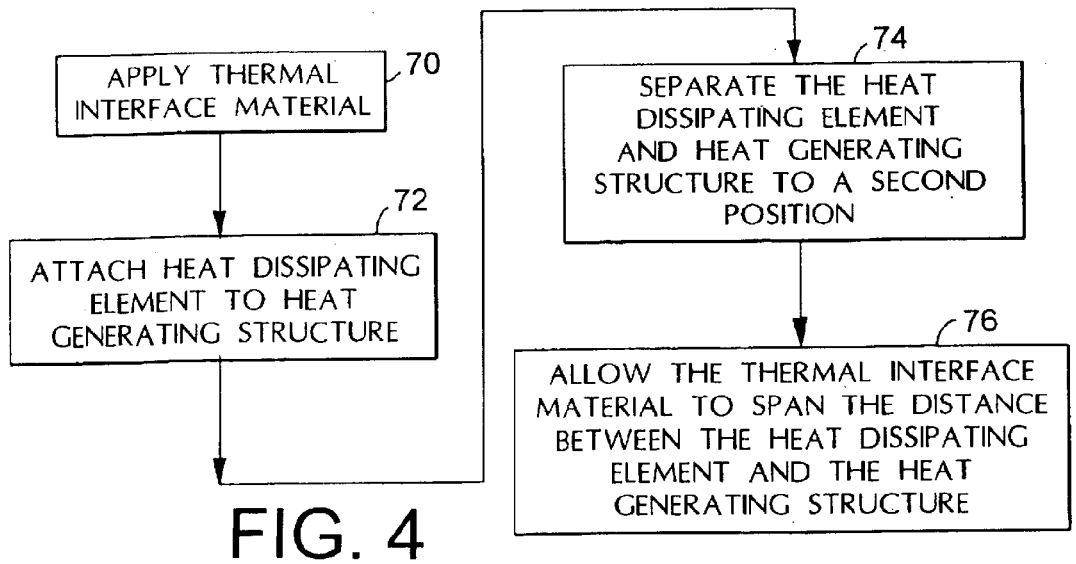
FIG. 4 is a flow chart.
Figure 3:
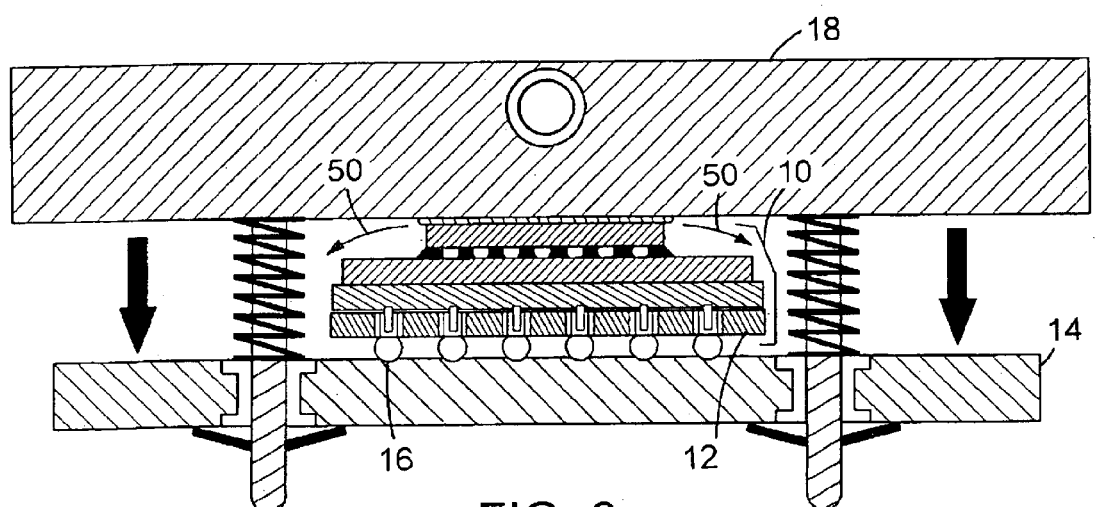

Referring to FIG. 3 and to the flow chart of FIG. 4, during manufacturing, after the microprocessor has been inserted into the mounted socket, a quantity of the thermally conductive material 26 is placed (70) on the top surface of the microprocessor or on the bottom surface of the heat sink. The heat sink is then attached (72) by lowering it over the microprocessor and the pins are inserted through the holes and into the locking clips. The heat sink is pushed down (forcing the pins further into the locking clips) until the bottom surface of the heat sink contacts the top surface. The thermal grease is squeezed from the gap as indicated by arrows 50 but remains temporarily in the vicinity of the perimeter of the gap.

Next, referring again to FIG. 2, when the downward force on the heat sink is released, the springs force the heat sink upward. The lower ends of the pins are grabbed by the sharp edges of the holes in the locking clips and, as the heat sink moves upward (74), the pins pull up on the locking clips, distorting them from their original conical shapes to flat shapes that define jammed positions. The vertical distance traveled from the lowest position of the heat sink to the position at which the clips are jammed is relatively constant from unit to unit and defines the gap. As the heat sink is pushed upward, the thermal grease is drawn back (76) into the gap by viscous forces and suction as indicated by arrows 60, to fill the gap and provide the desired thermal path. In this final position, no compressive force is applied to thermal grease, which therefore is able to remain in place and provide a good thermal path over a long period of time.

In particular implementations, the microprocessor could be a Pentium® II processor or Pentium® III processor or other microprocessor, for example, of a kind that is surface mounted for use in notebook computers.

Other arrangements can be used to attach the heat sink to the board, including a leaf spring or tab, a screw spring combination, an external heat sink like clip with a spring between the heat sink and that board.

What is claimed is:

1. A method of disposing thermal interface material between a heat dissipating element and a heat generating structure, the method comprising:

attaching the heat dissipating element to the heat generating structure in an initial position with the thermal interface material between them, separating the heat dissipating element and heat generating structure to form a gap of a predetermined size between the element and the structure, including using a retaining element having a predetermined deformation to limit the movement of the heat dissipating element away from the heat generating element, the predetermined deformation of the retaining element defining the predetermined size of the gap, and allowing the thermal interface material to span the distance between the heat dissipating element and the heat generating structure after the predetermined deformation has occurred.

2. The method of claim 1 in which compression is applied between the heat dissipating element and the heat generating structure to reach the initial position, and no compression is applied between the heat dissipating element and the heat generating structure to form the gap.

3. The method of claim 1 in which the thermal interface material comprises a high-conductivity thermal grease or gel.

4. The method of claim 1 in which the retaining element comprises a clip.

5. The method of claim 1 in which the retaining element deforms when the heat dissipating element is biased away from the heat generating element.

6. The method of claim 1 in which the thermal interface material comprises a high-conductivity thermal grease or gel.

7. The method of claim 1 also comprising applying the thermal interface material to the heat dissipating element or the heat generating structure.

8. The method of claim 1 in which separating the heat dissipating element and heat generating structure comprises using a resilient element to move the heat dissipating element away from the heat generating structure.

9. The method of claim 1 also comprising passing a pin freely in a first direction through the retaining element while attaching the heat dissipating element to the heat generating structure, the pin being attached to a support that is attached to the heat dissipating element.

10. The method of claim 9 also comprising moving the pin in a second direction opposite to the first direction while separating the heat dissipating element and heat generating element, the retaining element preventing movement of the pin relative to the retaining element in the second direction, the retaining element permitting movement of the pin by a predetermined amount relative to the heat generating structure in the second direction.

11. A method of disposing thermal interface material between a heat dissipating element and a heat generating element comprising:

with the heat generating element and the heat dissipating element held together with the thermal interface material in between, increasing a gap between the heat dissipating and heat generating element by a predetermined amount that is governed by a predetermined amount of deformation of a retaining element, and allowing the thermal interface material to span the increased gap between the heat dissipating element and heat generating element.

12. The method of claim 11 also comprising moving the heat dissipating element towards the heat generating element to an initial position in which the heat generating element and heat dissipating element are held together with the thermal interface material in between.

13. The method of claim 12 also comprising moving a pin freely in a first direction through the retaining element while moving the heat dissipating element towards the heat generating element, the pin being attached to a support that is attached to the heat dissipating element.

14. The method of claim 13, also comprising moving the pin in a second direction opposite to the first direction while the gap is increased, the retaining element preventing movement of the pin relative to the retaining element in the second direction, the retaining element permitting movement of the pin by a predetermined amount relative to the heat generating element in the second direction.

15. The method of claim 12 in which compression is applied between the heat dissipating element and the heat generating structure to reach the initial position.

16. The method of claim 15 in which no compression is applied between the heat dissipating element and the heat generating structure when the gap is increased.

17. The method of claim 11 in which the thermal interface material comprises a high-conductivity thermal grease or gel.

18. The method of claim 11 in which the retaining element comprises a clip.

19. The method of claim 11 also comprising applying the thermal interface material to the heat dissipating element or the heat generating structure.

20. The method of claim 11 also comprising using a resilient element to move the heat dissipating element away from the heat generating structure to increase the gap.

* * * * *